United States Patent [19]

Tamor et al.

[11] Patent Number: 5,110,577
[45] Date of Patent: May 5, 1992

[54] PROCESS OF DEPOSITING A CARBON FILM HAVING METALLIC PROPERTIES

[75] Inventors: Michael A. Tamor, Toledo, Ohio; Kenneth C. Hass, Plymouth, Mich.

[73] Assignee: Ford Motor Company, Dearborn, Mich.

[21] Appl. No.: 620,599

[22] Filed: Jan. 28, 1991

Related U.S. Application Data

[62] Division of Ser. No. 464,067, Jan. 12, 1990.

[51] Int. Cl.⁵ ............... C01B 31/02; C23C 16/00
[52] U.S. Cl. ................... 423/445; 423/446; 423/449; 427/249; 427/255.1
[58] Field of Search ........... 423/446, 445, 449, 255.1; 156/DIG. 68; 427/249, 38, 39

[56] References Cited

U.S. PATENT DOCUMENTS

| | | | |
|---|---|---|---|
| 4,915,977 | 4/1990 | Okamoto et al. | 423/446 |
| 4,935,303 | 6/1990 | Ikoma et al. | 427/45.1 |
| 4,961,958 | 10/1990 | Desphandey et al. | 427/42 |

FOREIGN PATENT DOCUMENTS

| | | | |
|---|---|---|---|
| 284190 | 9/1988 | European Pat. Off. | 427/249 |
| 54995 | 3/1985 | Japan | 423/446 |
| 186499 | 9/1985 | Japan | 423/446 |
| 195092 | 10/1985 | Japan | 423/446 |
| 103994 | 4/1989 | Japan | |

OTHER PUBLICATIONS

*Carbon*, vol. 23, No.1, "Layer Chain Carbons", (1985) pp. 3-7.

Primary Examiner—Michael L. Lewis
Assistant Examiner—Stephen G. Kalinchak
Attorney, Agent, or Firm—Joseph W. Malleck; Clifford L. Sadler

[57] ABSTRACT

A superhard carbon composition, having a crystal structure cell consisting of (i) a unit cell of six carbon atoms with crystallographic hexagonal symmetry, (ii) all carbon atoms in flat three-fold coordinated configurations (sp²bonding), and (iii) carbon atoms in layers of chains which zig-zag in a direction normal to the layers with each layer being rotated 60° with respect to its adjacent layer. The composition has a density of about 3.2 g/cm³, a bulk modulus and a hardness exceeding diamond (bulk modulus is 6.9 Mbar), and a bonding length of 1.45-1.47 angstroms.

4 Claims, 6 Drawing Sheets

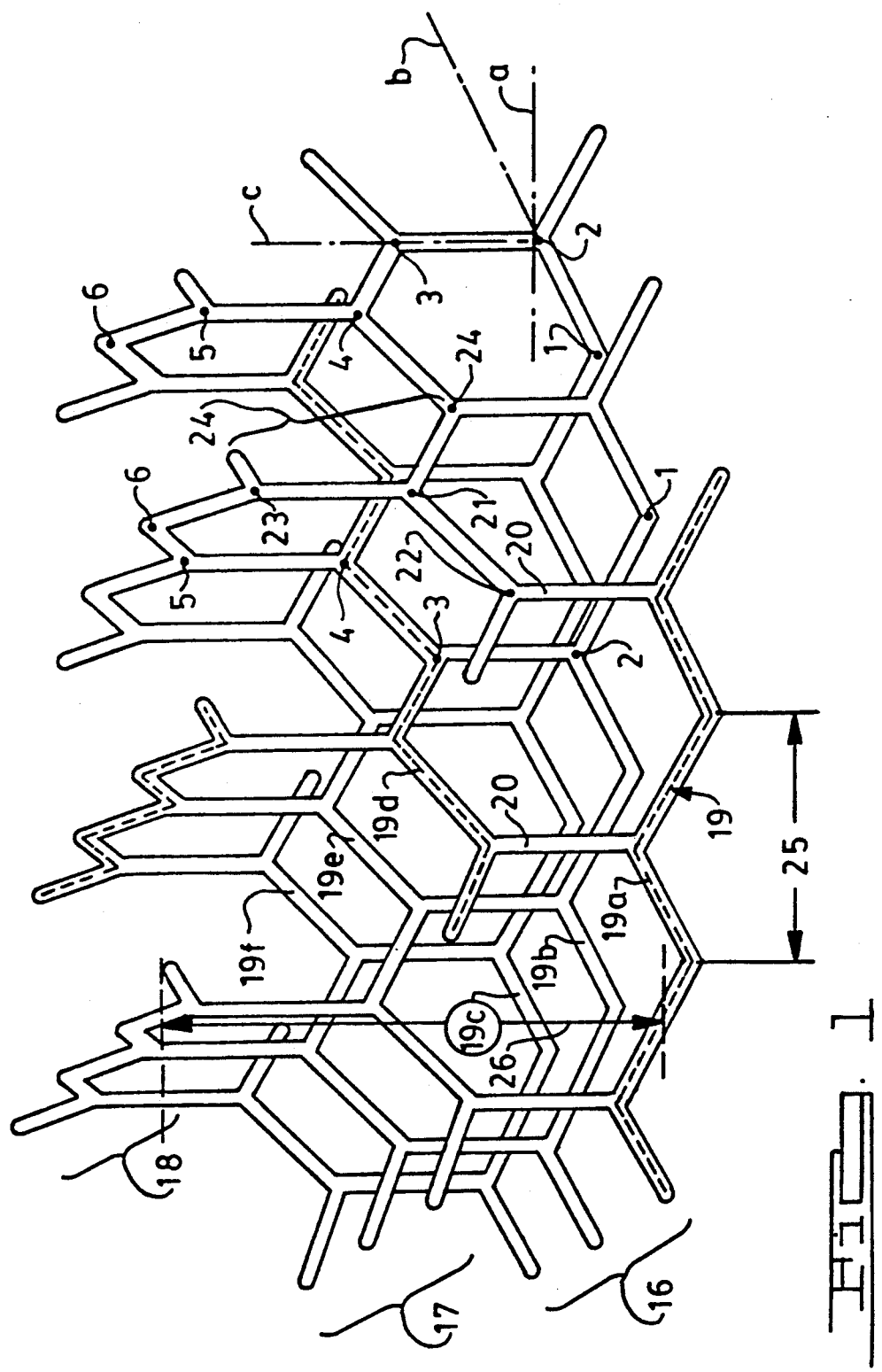

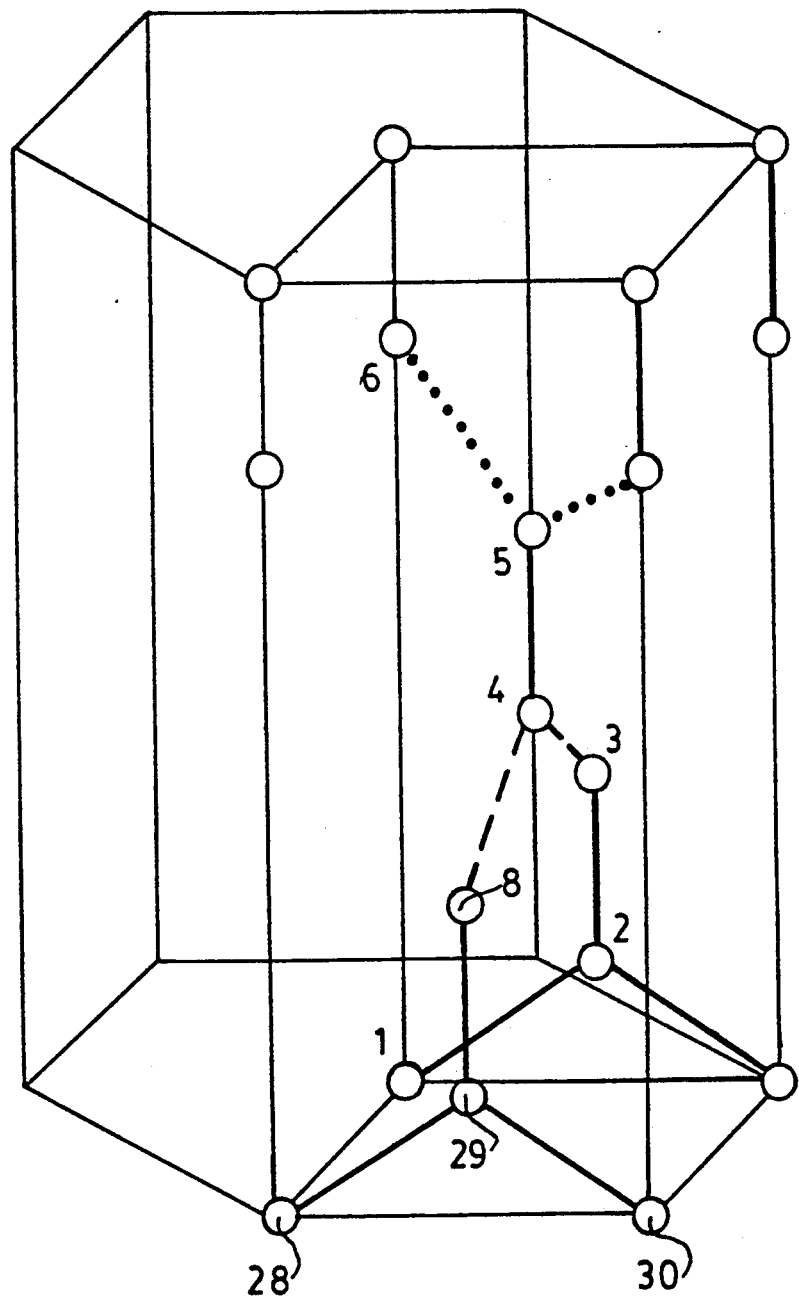
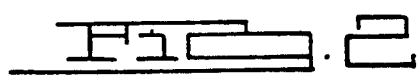

PROCESS OF DEPOSITING A CARBON FILM HAVING METALLIC PROPERTIES

This is a division of application Ser. No. 07/464,067, filed Jan. 12, 1990, now pending.

BACKGROUND OF THE INVENTION

1. Technical Field

This invention relates to the field of superhard materials and allotropic forms of carbon, and more particularly to a new phase of carbon embodying a new crystal structure comprised of three-fold coordinated carbon only.

2. Discussion of the Prior Art

Superhard materials refers to solids of hardness comparable to or in excess of that of diamond Examples are diamond itself, cubic boron nitride (C-BN, tradename: borazon), boron suboxides ($B_{22}O$), and a new (possibly hypothetical) compound $C_3N_4$. The extreme hardness of such materials is exploited in high-speed cutting and grinding tools and low-friction, long-wearing bearing surfaces. Recent advances in chemical vapor deposition (CVD) of such materials in thin film form has broadened the application of superhard materials as surface coatings. However, materials even harder than diamond have been avidly sought with unsatisfactory results This invention has discovered a new crystalline form of carbon which is harder than diamond, less dense than diamond, is metallic, and characterized by three-fold atomic coordination ($sp^2$ bonding) only.

The only mention in the prior art of which applicants are aware that a carbon Phase harder than diamond has been made appears in articles by N.N. Matyusenko and V.E. Strel'nitskii, in *Journal of Experimental and Theoretical Physics Letter*, Vol. 30, page 199 (1979); and by A.S. Bakai and V.E. Strel'nitskii, in *Annals of Technical Physics*. Vol. 51, page 2414 (1981). Such articles purport to describe the process of formation and properties of a "super-dense" form of carbon which is both harder and denser than carbon. The existence of this new carbon phase, called C-8 or "supercubane" is a subject of dispute in the technical community because of its extreme difficulty to make and isolate. C-8 carbon consists of four-fold coordinated ($sp^3$ bonded) carbon in a highly distorted configuration and, disadvantageously, will require high pressure processing.

Other investigators have speculated that other allotropic forms of carbon may exist, but this invention has established and teaches how to make a new allotropic form of carbon which is consists of $sp^2$ coordinated carbon only, is metallic, is harder than diamond, but less dense, and has a higher bulk modulus than diamond.

SUMMARY OF THE INVENTION

This invention has discovered a new crystalline phase of carbon having a crystal structure consisting of (i) a repeating unit cell of six carbon atoms with crystallographic hexagonal symmetry, (ii) all carbon atoms in flat, three-fold coordinated configurations, and (iii) carbon atoms in layers of chains which zig-zag in a direction normal to the layers are joined to adjacent layers by vertical bonds and rotate by 60° from layer to layer. The new crystalline form of carbon is further characterized by a density of about 3.2 g/cm³ and is intrinsically harder than diamond. Because of the hexagonal symmetry and six atoms per cell, the structure shall hereinafter be referred to as "the H-6 structure" and the embodiment of the new crystal structure in carbon shall be referred to as "H-6 carbon". H-6 carbon is fundamentally different from diamond, in which each atom is four-fold coordinated ($sp^3$ bonded); every carbon atom in H-6 carbon is three-fold coordinated ($sp^2$ bonded) and the bonds are shorter and stronger.

The H-6 carbon structure is topologically related to diamond in the sense that it can be smoothly distorted from H-6 to diamond without breaking or crossing any existing bonds. Because $sp^2$ carbon-carbon bonds are appreciably shorter (1.42-1.47 angstroms) and therefore stronger than $sp^3$ C-C bonds (1.54 angstroms), the bulk modulus of H-6 carbon, which is a measure of intrinsic hardness, is as much as 50% larger than that of diamond (6.9 Mbar as opposed to 4.4 Mbar for diamond). Also, unlike diamond, H-6 carbon is metallic in that it exhibits significant electrical conductivity at room temperature that is not eliminated by cooling to low temperature.

SUMMARY OF THE DRAWINGS

FIG. 1 is a schematic illustration of the H-6 structure showing the bonds between neighboring atoms as double lines;

FIG. 2 is a drawing of the H-6 unit cell with its six nonequivalent atomic sites numbered as 1–6;

DETAILED DESCRIPTION AND BEST MODE

Figure 5:
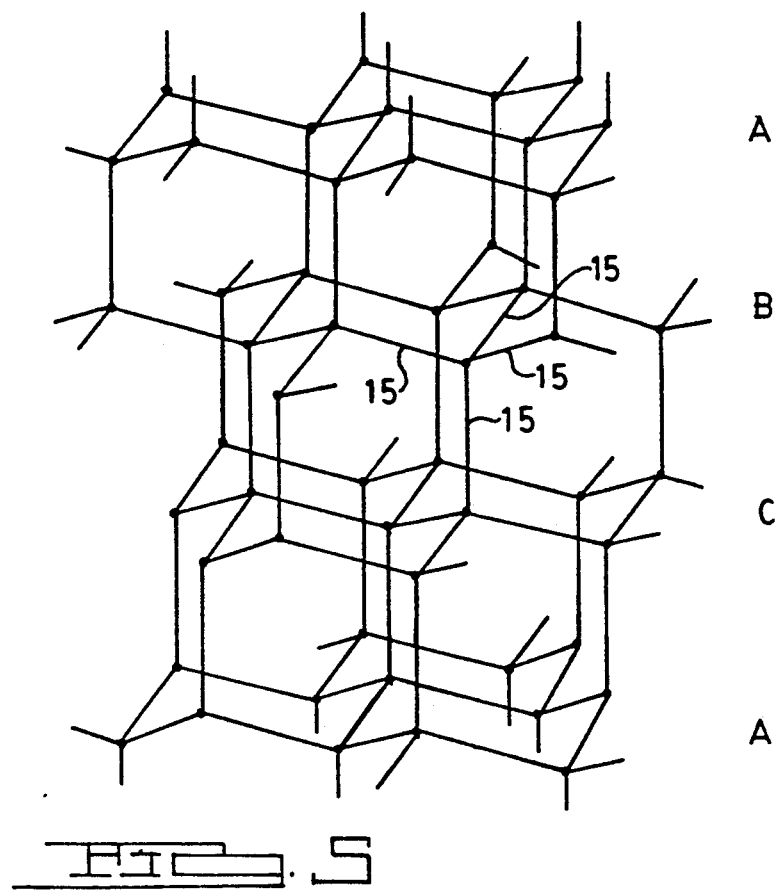
FIGS. 5–6 are stylized "ball-and-stick" drawings of the lattice structures of diamond (FIG. 5) and a related all-$sp^3$ form of carbon (lonsdaleite, FIG. 6) which has properties very similar to those of diamond.
Figure 6:
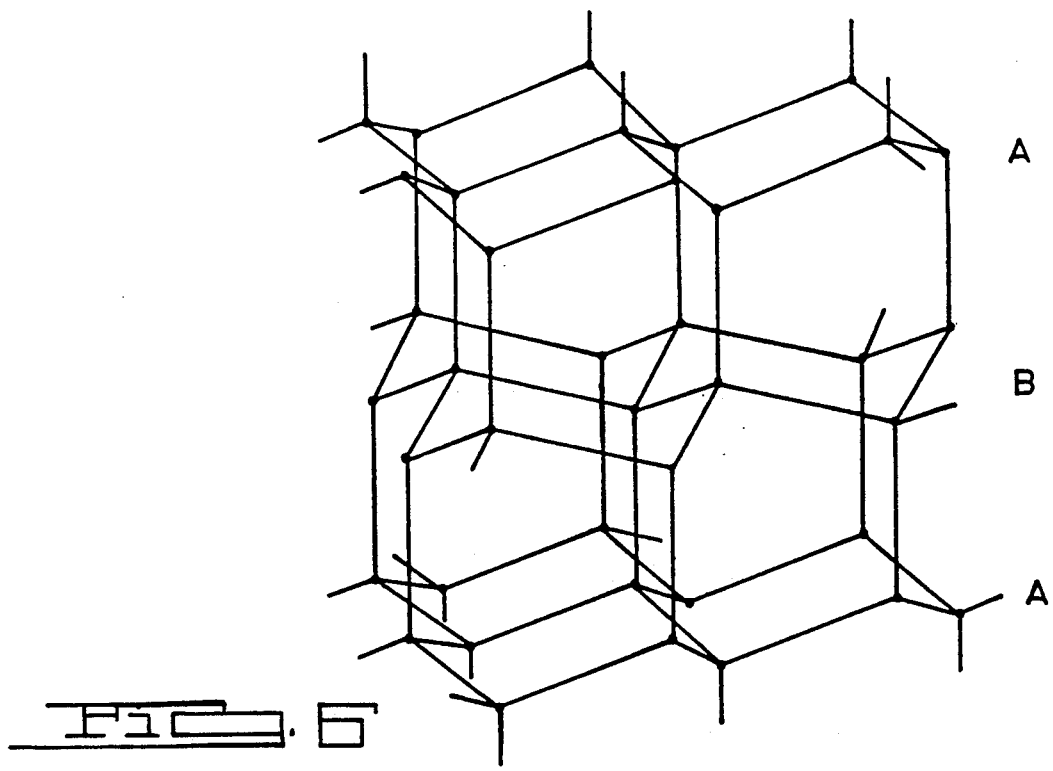
Figure 7:
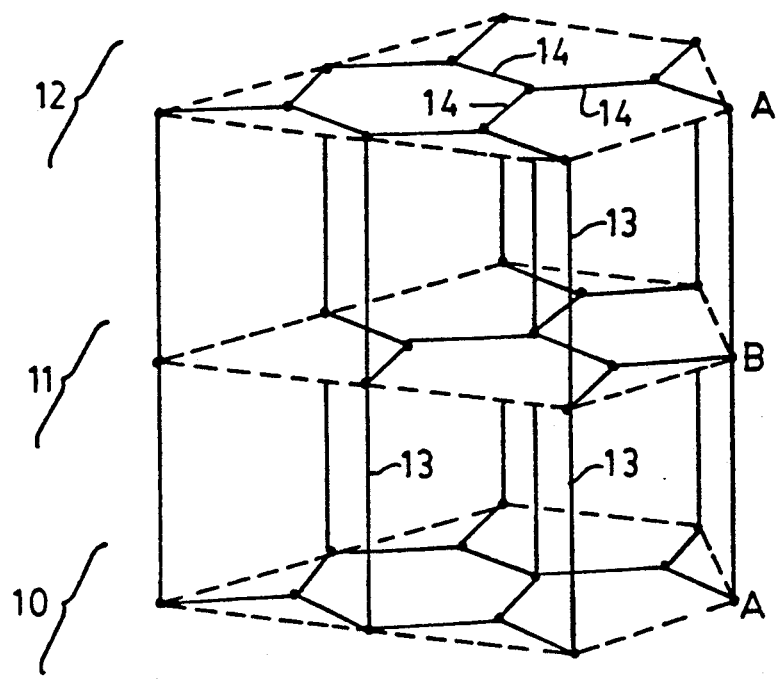
FIGS. 7–8 are stylized drawings of the lattices of two known forms of graphite: hexagonal (FIG. 7) and rhombohedral (FIG. 8).
Figure 8:
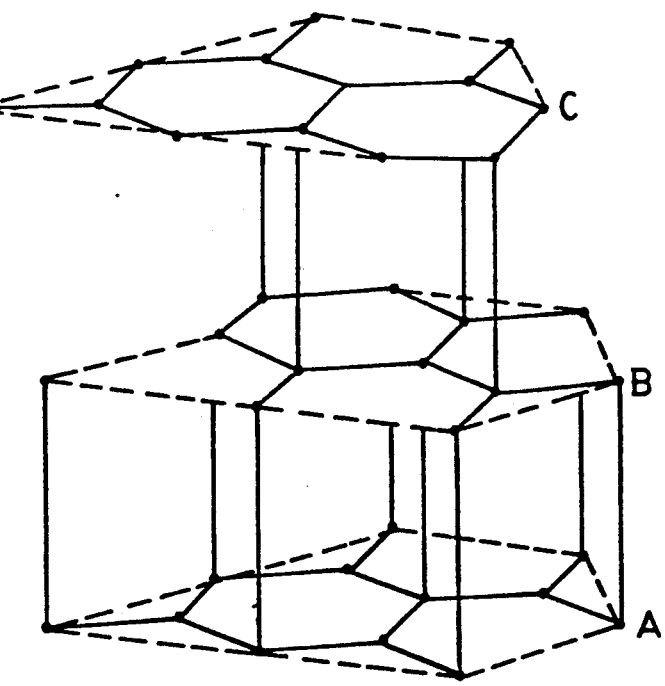

The great hardness of H-6 carbon can be understood by comparison to graphite Graphite consists of flat layers (sheets) 10, 11, 12 of hexagonal rings of $sp^2$ coordinated carbon, similar in appearance to chicken wire (see FIGS. 7–8). GraPhite is in a sense a two-dimensional material in that there are no strong covalent bonds between the sheets, the sheets being held together only by the much weaker Van der Waals forces 13 associated with the fourth unused bonding electron (the so-called $\pi$ electron) at each carbon atom; the bonding length between sheets is long, about 3–4 angstroms. In the plane of the layers, graphite is actually comparable in hardness to diamond--the elastic modulus is comparable and the optical phonon (a lattice vibration) frequency is significantly higher. This hardness is due to the greater amount of electronic charge associated with the $sp^2$ bonds 14 relative to the $sp^3$ bonds 15 of diamond (see FIG. 5), which in turn results in a much shorter bond length (1.42 angstroms versus 1.55 angstroms in diamond).

Figure 3:
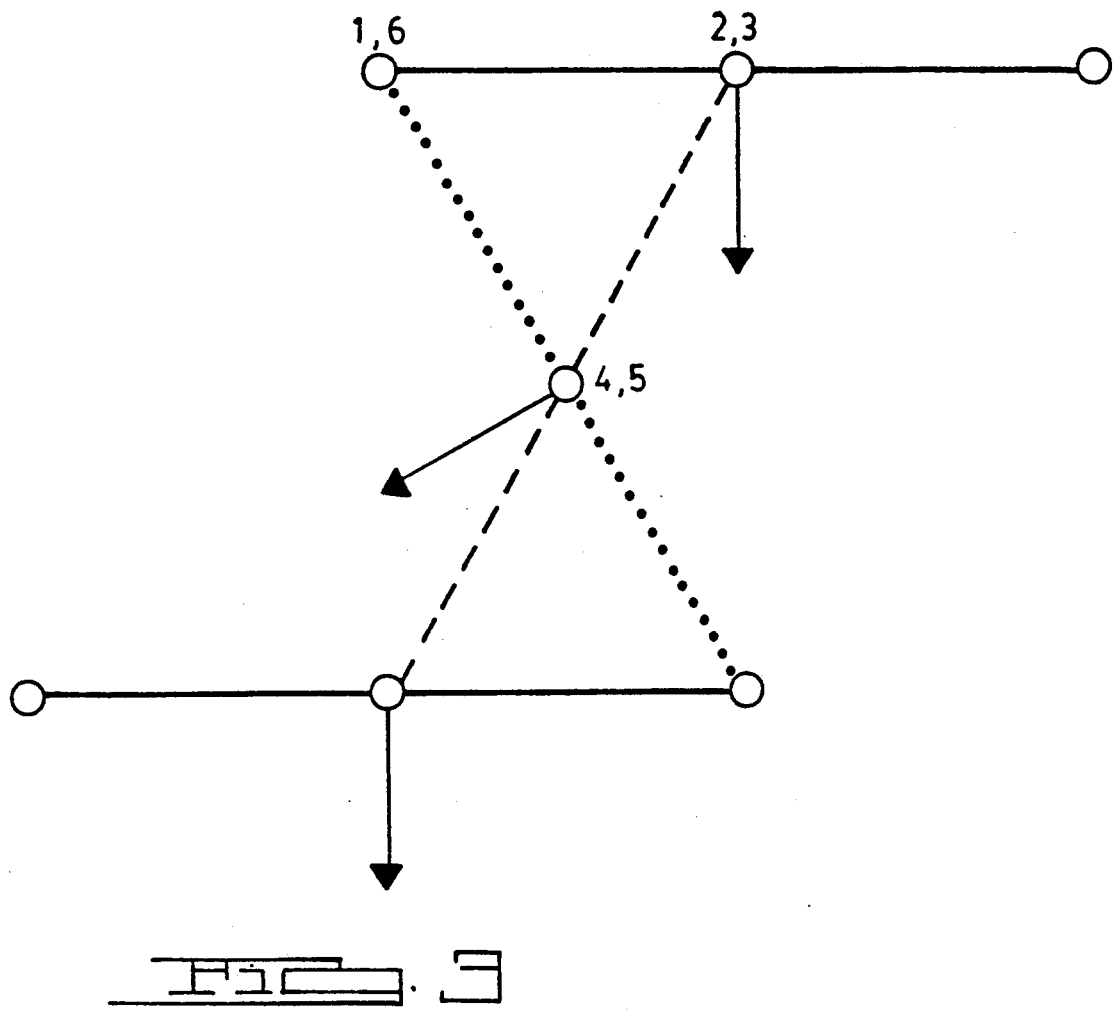
FIG. 3 is a plan view (looking down along the "vertical" axis) of the H-6 unit cell shown in FIG. 2, the dashed lines indicate the atomic motions associated with the conversion to the diamond structure.

The H-6 structure (as shown in FIG. 1) is comprised of layers 16, 17, 18, which in turn has carbon chains 19; the layers are joined by bonds 20 along the c (vertical) axis. Each layer extends generally along an a-b plane and the chains 19 are substantially all aligned within a layer (such as chains 19a, 19b, 19c in layer 16, and chains 19d, 19e, 19f in layer 17). The atoms of a chain in a layer zig-zag, such as atoms 28, 29, 30 in FIG. 2. All carbon atoms are bonded to three other carbon atoms (such as 21 bonded to 22, 23, 24 in the flat $sp^2$ coordinated configuration 25. The alignment of chain structures comprising each layer rotates by 60° about the c axis from layer to layer, resulting in hexagonal symmetry. With an in-chain repeat interval 25 of two atoms, and a vertical repeat interval 26 of three layers, the H-6 structure has a unit cell consisting of six atoms (see numbering of atoms in FIGS. 1 and 2). The H-6 structure is topologically related to diamond in that the lattice can be continuously deformed to that of diamond without breaking or crossing any existing bonds. FIG. 3 shows a top view of the H-6 unit cell and indicates (the dashed lines) the atomic motions associated with the conversion to diamond (numbering corresponds to FIG. 2).

Differences in crystal structure between H-6 carbon and other forms of carbon can be seen by comparing FIG. 1 to FIGS. 5 and 6 for diamond and related lonsdaleite, and FIGS. 7 and 8 for known forms of graphite. Diamond has a cubic lattice built up from $sp^3$ bonded carbon atoms arranged in tetrahedra; the lattice layers follow the sequence ABCABC so that every third layer is identical (see FIG. 5). Lonsdaleite is a hexagonal modification of diamond also with tetrahedral coordination, but with layers stacked ABAB (see FIG. 6). Lonsdaleite has been found in very small quantities in meteorites and shock-quenched diamond and has properties much like that of diamond.

Graphite consists of layers of $sp^2$ bonded six-fold rings of carbon (resembling chicken wire, see FIGS. 7 and 8). In both hexagonal and rhombohedral graphite the layers are stacked such that half of the atoms are directly above atoms in the adjacent layers, and half are centered over the open rings of the adjacent layers. There are two possible stacking sequences. Hexagonal graphite has stacking ABAB and is shown in FIG. 7, while rhombohedral graphite has stacking ABCABC (see FIG. 8).

H-6 carbon also embodies an ABC stacking sequence and consists of $sp^2$ bonded carbon only, but is distinct from graphite in that it contains no closed rings.

Physical Properties

The H-6 structure is a topologically rigid; three-dimensional network of short and stiff $sp^2$ carbon-carbon bonds (it cannot be collapsed through bond rotations). The excess bond charge (over that of diamond) will be delocalized along the chains. Such electron delocalization renders a material metallic. The hydrocarbon polymer polyacetylene, analogous to a single chain in the H-6 structure to which H is added, is a poor metal due to the tendency of the electrons to gather on alternating carbon-carbon bonds. When such bond alternation is overcome, polyacetylene is an excellent electrical conductor. This bond alternation does not occur in H-6 carbon. Diamond is not metallic and graphite is semimetallic (a poor metal).

H-6 carbon has a density of about 3.2 g/cm$^3$, less than that of diamond (3.5 g/cm$^3$), but much greater than that of both forms of graphite (2.25 g/cm$^3$) Given that the covalent $sp^2$ bonds of the H-6 carbon are shorter and stronger than the $sp^3$ bonds of diamond, reliable quantum mechanical calculations show that H-6 carbon is significantly harder than diamond--H-6 carbon has a bulk modulus of approximately 6.9 Mbar, as opposed to a 4.4 Mbar for diamond.

The H-6 structure has an intra-chain bond length of 1.47 angstroms and an inter-chain bond length (along the c axis) of 1.45 angstroms. The cohesive energy of H-6 carbon is 6.94 eV/atom, 0.43 eV/atom smaller than that of graphite. While this difference is much larger than the .025 eV/atom difference between diamond and graphite, the H-6 structure is metastable against spontaneous conversion to diamond. The calculated energy barrier to diamond along the high symmetry path in FIG. 3 is sufficient to establish the metastable condition.

Forming

H-6 carbon is metastable with respect to conversion to diamond or graphite. Because of its topological relationship with diamond, H-6 carbon must convert to diamond before conversion to graphite. Thus, only stability with respect to conversion to diamond is at issue. Because H-6 carbon is less dense than diamond, it cannot be formed by high pressure processes by which diamond is formed both in nature and in the laboratory; the product of such high pressure processes must always be diamond or a denser material. Thus, H-6 carbon cannot occur in nature and, with certainty, is a new composition of matter.

This invention utilizes very low pressures accompanied by the technique of chemical vapor deposition (CVD) to generate and deposit H-6 carbon on a specially conditioned substrate under critical deposition conditions of atmosphere and temperature under which the H-6 carbon material is thermodynamically stable as a surface phase and subsurface conversion to the more stable diamond phase is inhibited.

Low pressure CVD of H-6 carbon is carried out by energizing a dilute mixture of hydrocarbon gas (e.g., methane or acetylene) in hydrogen either by thermal (e.g., a hot filament) or electromagnetic (DC, radio frequency or microwave plasma) means to sufficient chemical activity that a significant partial pressure of atomic hydrogen and a high density of reactive hydrocarbon radicals is obtained. In the case of thermal excitation, the excited gas mixture must be quickly cooled, usually by thermal expansion to achieve a metastable gas atmosphere in which the gas kinetic temperature is lower than the temperature that would be assigned to the chemical composition were it at equilibrium (the so-called "chemical temperature"). In the case of plasma excitation, the condition of gas metastability may be achieved in the region of excitation due to the inevitable discrepancy between the electron temperature, which is very high and so controls the gas chemistry, and the ion temperature which dominates the gas temperature and is quite low because the electromagnetic excitation couples mainly to the electrons. Deposition from plasma excited gas may be performed within the plasma region (immersion deposition) or, if needed, the plasma excited gas can be extracted and made to flow across a substrate outside the region of excitation (downstream deposition).

The substrate may be selected from the group of materials which is not affected by the high temperature and the reducing atmosphere of H-6 carbon CVD. A suitable substrate can be the <111>crystallographic surface of diamond itself, the surface of which is topologically identical to one layer of H-6 carbon. The substrate temperature should be kept quite low, 300°-400° C., which is low in comparison to standards of diamond deposition (600°-1000° C.). The low substrate temperature is necessary to promote formation of $sp^2$ structures and suppress collapse into the undesirable diamond structure. The temperature must be just high enough to permit etching of any true graphite which might form, but not so high as to allow etching of H-6 carbon.

The allowed range of substrate temperatures in which the above conditions are met is in turn determined by the pressure, temperature, and composition of the excited hydrocarbon/hydrogen gas atmosphere. The overall pressure must be quite low, 0.1 to 1.0 Torr, relative to the standards for diamond CVD (10–100 Torr) to enhance the lifetime and therefore the population of atomic hydrogen which is essential in stabilizing the H-6 carbon surface, etching of graphitic structures, and promotion of the deposition chemistry. The feed gas must be relatively rich in hydrocarbons (in the range of 5–50% methane in hydrogen) to promote usefully rapid formation of $sp^2$ structures on the substrate. The rate of formation and purity of the H-6 carbon deposit will depend in detail on the chemical composition of the metastable gas atmosphere. Addition to the feed gas of oxygen-containing species (water vapor, methanol, acetone, oxygen, carbon monoxide or carbon dioxide) can have significant effects on the rate and character of the deposition.

Excitation of the gas mixture can be achieved by a variety of means. Each alternative has advantages and drawbacks associated therewith. A hot firmament may expose the substrate to excessive radiant energy and thereby overheat it. Immersion in an overly energetic plasma may do the same. The best means are those in which the growth substrate is not directly exposed to the excitation region. This is difficult to achieve with a hot filament because shielding the radiative load requires intervening surfaces which interfere with gas flow and provide surfaces for the recombination of atomic hydrogen. Remote excitation with downstream deposition is more readily achieved by plasma excitation in which the hydrogen/hydrocarbon mixture is excited in a prechamber from which it flows across the substrate.

Figure 4:
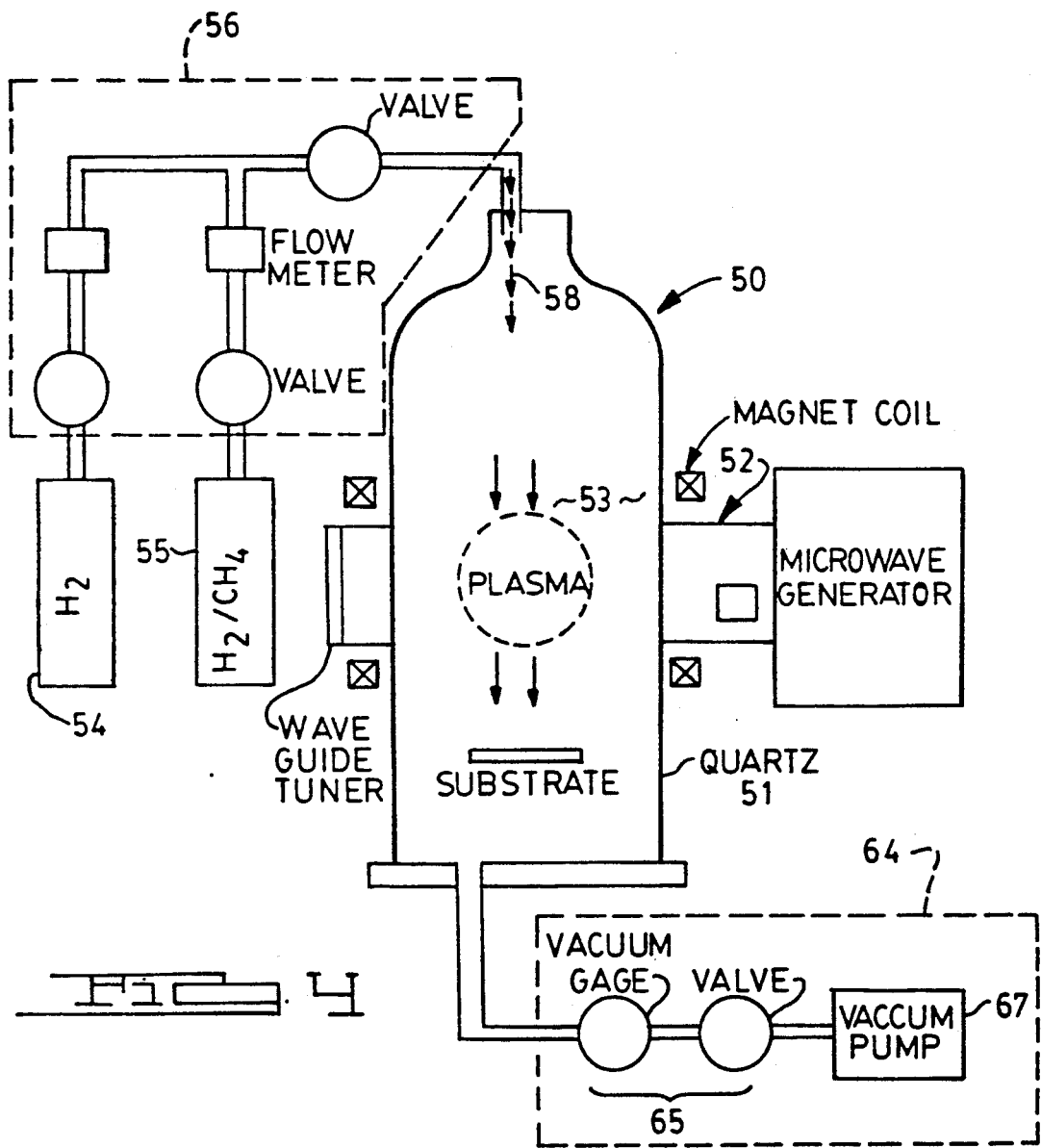
FIG. 4 is a schematic illustration of the apparatus useful in carrying out the chemical vapor deposition of H-6 carbon.

Deposition of H-6 carbon can be carried out by use of an apparatus similar to that shown in FIG. 4 wherein a microwave plasma discharge apparatus 50 is shown. A quartz tube 51 is set across a microwave guide tube 52 which serves as the plasma excitation chamber 53. The feed gases described above are supplied from tanks 54 and 55 and held in proper proportions by an automatic flow controller 56 to provide a predetermined gas mixture 58 which is introduced at the top of the reactor (chamber 53). The pressure control system 64 has a pressure control valve 65 and a vacuum pump 67 to achieve chamber pressures of 0.1–1.0 Torr. The gas mixture is controlled to a total flow rate through the chamber of about 100–1000 sccm (standard cubic centimeters per minute) during active deposition. Microwave plasma is generated to heat the gas mixture in the chamber and a substrate is placed therein. The gas passes through the region of microwave discharge, the efficiency of which is enhanced by the imposition of a magnetic field such that the electron cyclotron resonance (ECR) condition is met within the Plasma. For a microwave frequency of about 2.45 GHz (FCC standard), the required field is approximately 850 Gauss. The plasma should be confined to the center of the quartz tube. The substrate is attached to a holder 61 made of a suitable heat and chemical resistant material which can heat or cool the substrate as necessary to maintain the desired surface temperature. The substrate is usually held within the plasma for the CVD of diamond, but should be kept outside (downstream) for H-6 carbon deposition. The desired distance from the plasma is determined mainly by the gas flow velocity, but is also affected by the gas composition and power density of the microwave excitation. The total gas pressure in the reactor is held constant by a pressure controller on the vacuum pump at the gas exit from the chamber.

H-6 carbon will appear on the surface of diamond during conventional CVD growth of diamond, and convert to diamond beneath the growing surface (thus the above-mentioned modifications in CVD to suppress such conversions). H-6 carbon will appear as very thin surface phases, stable under the conditions of conventional CVD growth of diamond. H-6 carbon is an intermediate structure necessary in the formation of diamond in the CVD process.

While particular embodiments of the invention have been illustrated and described, it will be obvious to those skilled in the art that various changes and modifications may be made without departing from the invention, and it is intended to cover in the appended claims all such modifications and equivalents as fall within the true spirit and scope of this invention.

What is claimed:

1. A method of making a carbon material comprised of the following steps: depositing said material onto a temperature-resistant substrate by excitation of a gas mixture comprised of 5–50% methane in hydrogen, said gas mixture being maintained in the pressure range of 0.1–1.0 Torr, said substrate being maintained in the temperature range of 300°–400° C.

2. The method as in claim 1, in which said substrate is a diamond <111> face.

3. A method of making a carbon material comprising:
   (a) depositing said material onto a temperature-resistant substrate by excitation of a gas mixture comprised of 5–50% methane in hydrogen to produce a plasma, said gas mixture being maintained in the pressure range of 0.1–1.0 Torr; and
   (b) controlling said substrate so that it is maintained in the temperature range of 300°–400° C. and is laced proximately adjacent said plasma.

4. The method as in claim 3, in which said controlling of said substrate is carried out to locate the substrate downstream of the plasma.

* * * * *